(12) United States Patent
Wang

(10) Patent No.: US 8,673,774 B2
(45) Date of Patent: Mar. 18, 2014

(54) METHOD FOR FORMING A VIA IN A SUBSTRATE

(75) Inventor: Meng-Jen Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 414 days.

(21) Appl. No.: 13/051,501

(22) Filed: Mar. 18, 2011

(65) Prior Publication Data

US 2011/0171829 A1    Jul. 14, 2011

Related U.S. Application Data

(62) Division of application No. 12/241,219, filed on Sep. 30, 2008, now abandoned.

(30) Foreign Application Priority Data

Dec. 4, 2007  (TW) ............................... 96146101 A

(51) Int. Cl.
*H01L 21/44* (2006.01)
(52) U.S. Cl.
USPC .................... 438/667; 438/672; 257/E21.158
(58) Field of Classification Search
USPC .................. 438/667, 672, 675; 257/E21.158, 257/E21.006
See application file for complete search history.

(56) References Cited

U.S. PATENT DOCUMENTS

| 5,308,443 | A | 5/1994 | Sugihara |
| 5,998,292 | A | 12/1999 | Black et al. |
| 6,700,175 | B1 | 3/2004 | Kodama et al. |
| 6,809,421 | B1 | 10/2004 | Hayasaka et al. |
| 7,222,420 | B2 | 5/2007 | Moriizumi |
| 7,276,787 | B2 | 10/2007 | Edelstein et al. |
| 7,772,116 | B2 | 8/2010 | Akram et al. |
| 2003/0092279 | A1* | 5/2003 | Tsai et al. .................... 438/718 |
| 2003/0176058 | A1* | 9/2003 | Weidman et al. ............ 438/638 |
| 2004/0259292 | A1 | 12/2004 | Beyne et al. |

(Continued)

FOREIGN PATENT DOCUMENTS

| CN | 1684256 | 10/2005 |
| CN | 101281883 | 10/2008 |

(Continued)

OTHER PUBLICATIONS

United States Patent Office Final Office Action issued Jul. 11, 2012 for U.S. Appl. No. 13/085,311, Applicants, Meng-Jen Wang et al. (18 pages).

(Continued)

*Primary Examiner* — Kimberly Rizkallah
*Assistant Examiner* — Duy T Nguyen
(74) *Attorney, Agent, or Firm* — McCracken & Frank LLC

(57) ABSTRACT

The present invention relates to a method for forming a via in a substrate. The method includes the following steps: (a) providing a substrate; (b) forming a groove that has a side wall and a bottom wall on a first surface of the substrate; (c) forming a first conductive metal on the side wall and the bottom wall of the groove so as to form a central groove; (d) forming a center insulating material in the central groove; (e) forming an annular groove that surrounds the first conductive metal on the first surface of the substrate; (f) forming a first insulating material in the annular groove; and (g) removing part of the substrate to expose the first conductive metal, the center insulating material and the first insulating material.

20 Claims, 22 Drawing Sheets

(56) References Cited

U.S. PATENT DOCUMENTS

| | | | |
|---|---|---|---|
| 2006/0001174 A1 | 1/2006 | Matsui | |
| 2006/0118965 A1 | 6/2006 | Matsui | |
| 2006/0281307 A1* | 12/2006 | Trezza | 438/672 |
| 2007/0048896 A1 | 3/2007 | Andry et al. | |
| 2007/0184654 A1* | 8/2007 | Akram et al. | 438/675 |
| 2008/0041621 A1 | 2/2008 | Hsu et al. | |
| 2008/0164573 A1 | 7/2008 | Basker et al. | |

FOREIGN PATENT DOCUMENTS

| | | |
|---|---|---|
| JP | 2005219588 | 8/2005 |
| JP | 2007036060 | 2/2007 |
| TW | 200416897 | 9/2004 |
| TW | 200501386 | 1/2005 |
| TW | I239594 | 9/2005 |
| TW | 200707667 | 2/2007 |
| TW | 200715438 | 4/2007 |
| TW | I278263 | 4/2007 |
| TW | 200926259 | 6/2009 |

OTHER PUBLICATIONS

Office Action dated Jan. 4, 2012, for CN Patent Application No. 201010144216.7 (8 pages).

TIPO Office Action dated Apr. 10, 2013 for TW Patent Application No. 098146109, Applicant Advanced Semiconductor Engineering, Inc., with English translation (7 pages).

* cited by examiner

METHOD FOR FORMING A VIA IN A SUBSTRATE

This application is a DIV of Ser. No. 12/241,219 filed on Sep. 30, 2008 ABN & Taiwan. 096146101 filed Dec. 4, 2007

BACKGROUND OF THE INVENTION

1. Field of the Invention

The present invention relates to a method for forming a via in a substrate and a substrate with a via, and more particularly to a method for forming an insulating layer on a side wall of a via in a substrate by utilizing a polymer and a substrate with the via.

2. Description of the Related Art

FIGS. 1 to 3 show schematic views of a conventional method for forming a via in a substrate. First, referring to FIG. 1, a substrate 1 is provided. The substrate 1 has a first surface 11 and a second surface 12. Afterward, a plurality of grooves 13 are formed on the first surface 11 of the substrate 1. An insulating layer 14 is then formed on the side wall of the grooves 13 by chemical vapor deposition, and a plurality of accommodating spaces 15 are formed. The material of the insulating layer 14 is usually silicon dioxide.

Afterward, referring to FIG. 2, the accommodating spaces 15 are filled with a conductive metal 16. The material of the conductive metal 16 is usually copper. Finally, the first surface 11 and the second surface 12 of the substrate 1 are ground or etched so as to expose the conductive metal 16, as shown in FIG. 3.

In the conventional method, the insulating layer 14 is formed by chemical vapor deposition, so that the thickness of the insulating layer 14 on the side wall of the grooves 13 is limited, and is usually under 0.5 μm. Moreover, the thickness of the insulating layer 14 on the side wall of the grooves 13 is not even, that is, the thickness of the insulating layer 14 on the upper side wall of the grooves 13 is not exactly equal to that on the lower side wall of the grooves 13. Thus, the electrical capacity is not uniform.

Therefore, it is necessary to provide a method for forming a via in a substrate to solve the above problems.

SUMMARY OF THE INVENTION

The present invention is directed to a method for forming a via in a substrate. The method comprises the following steps: (a) providing a substrate having a first surface and a second surface; (b) forming a groove that has a side wall and a bottom wall on the first surface of the substrate; (c) forming a first conductive metal on the side wall and the bottom wall of the groove so as to form a central groove; (d) forming a center insulating material in the central groove; (e) forming an annular groove that surrounds the first conductive metal on the first surface of the substrate; (f) forming a first insulating material in the annular groove; and (g) removing part of the second surface of the substrate to expose the first conductive metal, the center insulating material and the first insulating material.

The present invention is further directed to a method for forming a via in a substrate. The method comprises the following steps: (a) providing a substrate having a first surface and a second surface; (b) forming an annular groove and a pillar on the first surface of the substrate so that the annular groove surrounds the pillar; (c) forming a first insulating material in the annular groove; (d) removing the pillar of the substrate so as to form a groove that has a side wall and a bottom wall on the substrate; (e) forming a first conductive metal on the side wall and the bottom wall of the groove so as to form a central groove; (f) forming a center insulating material in the central groove; and (g) removing part of the second surface of the substrate to expose the first conductive metal, the first insulating material and the center insulating material.

The present invention is further directed to a substrate with a via. The substrate comprises a substrate, a first insulating material, a center insulating material and a first conductive metal. The substrate has a first surface, a second surface and a via. The via penetrates the substrate, and has an inner side wall. The first insulating material is a hollow pillar disposed on the inner side wall of the via. The center insulating material is a solid pillar, disposed at the center of the via, and spaced from the first insulating material. The first conductive metal is disposed between the first insulating material and the center insulating material, and surrounds the center insulating material so as to form a hollow pillar.

The present invention is further directed to a substrate with a via. The substrate comprises a substrate, a first insulating material and a plurality of grooves. The substrate has a first surface, a second surface and a via. The via penetrates the substrate, and has an inner side wall. The first insulating material is disposed in the via and adhered to the inner side wall of the via. The grooves are disposed in the first insulating material; each of the grooves penetrates the first insulating material, and comprises a third insulating material and a third conductive metal. The third insulating material is a solid pillar disposed at the center of the groove, and the third conductive metal surrounds the third insulating material.

In the present invention, thicker insulating material can be formed in the via. Also, the thickness of the insulating material in the via is even. Moreover, the polymer is used as an insulating material in the present invention, so polymers with different materials can be chosen for specific processes.

DETAILED DESCRIPTION OF THE INVENTION

Figure 1:
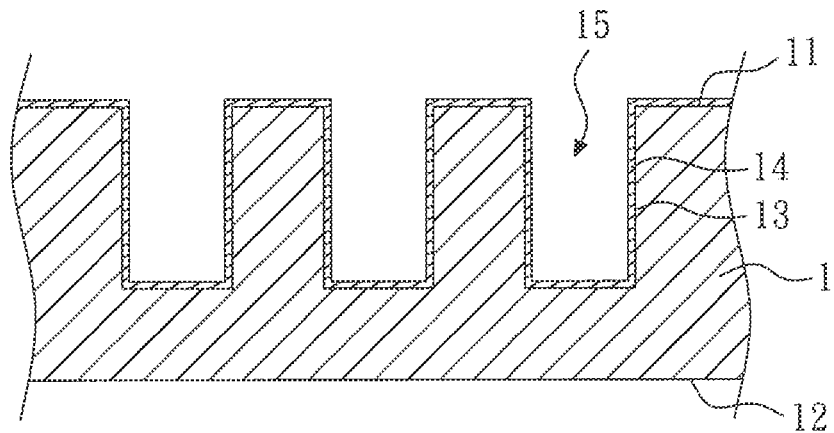
FIGS. 1 to 3 are schematic views of a conventional method for forming a via in a substrate.
Figure 2:
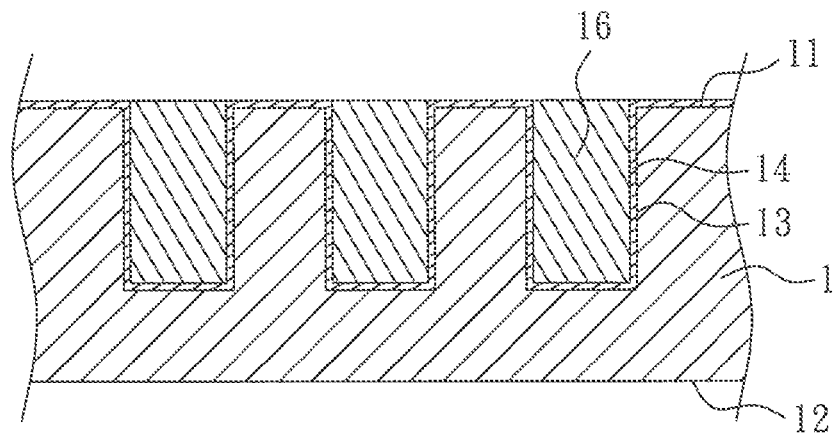
Figure 3:
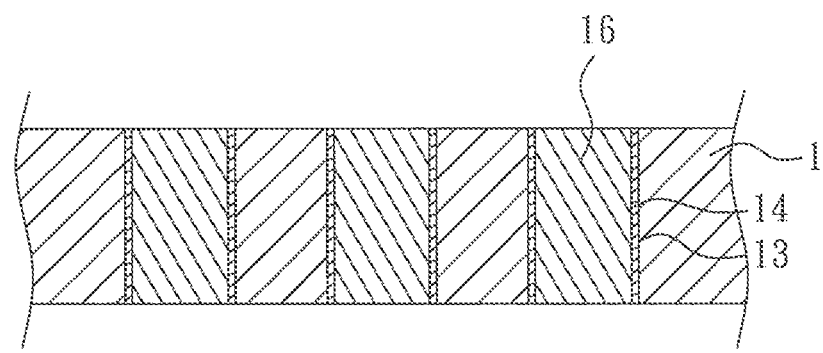
Figure 4:
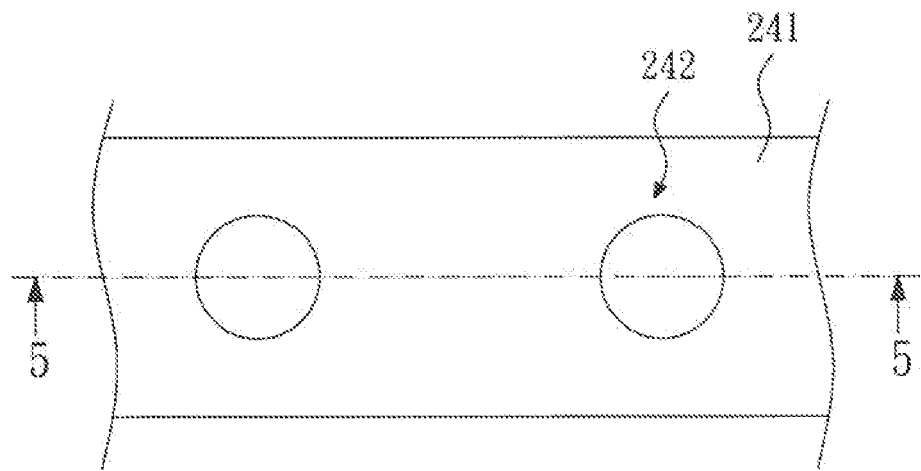
FIGS. 4 to 21 are schematic views of a method for forming a via in a substrate according to a first embodiment of the present invention.
Figure 5:
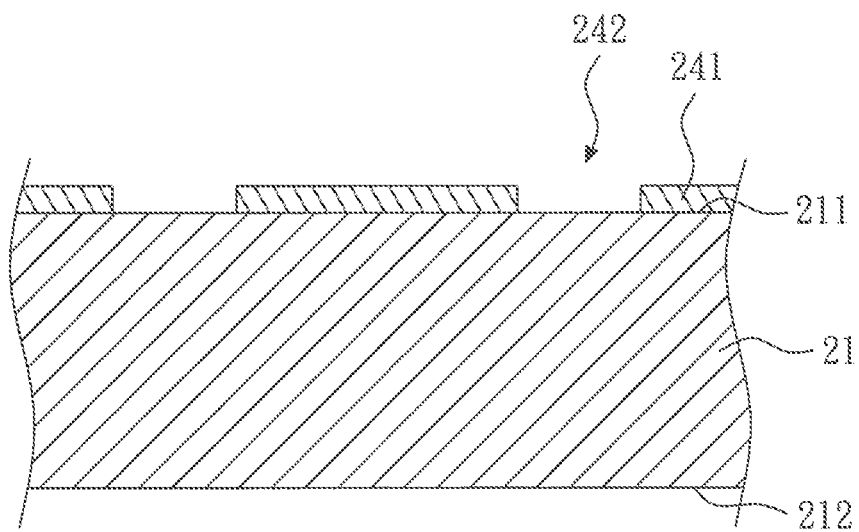

FIGS. 4 to 21 show schematic views of a method for forming a via in a substrate according to a first embodiment of the present invention. Referring to FIG. 4, a top view of the substrate, and FIG. 5, a cross-sectional view along line 5-5 in FIG. 4, first, a substrate 21 is provided. The substrate 21 has a first surface 211 and a second surface 212. The substrate 21 is, for example, a wafer or a silicon substrate. Afterward, a groove 231 (FIG. 6) is formed on the first surface 211 of the substrate 21. The groove 231 has a side wall 232 and a bottom wall 233. In the embodiment, a first photo resist layer 241 is formed on the first surface 211 of the substrate 21, and a first opening 242 is formed on the first photo resist layer 241.

Figure 6:
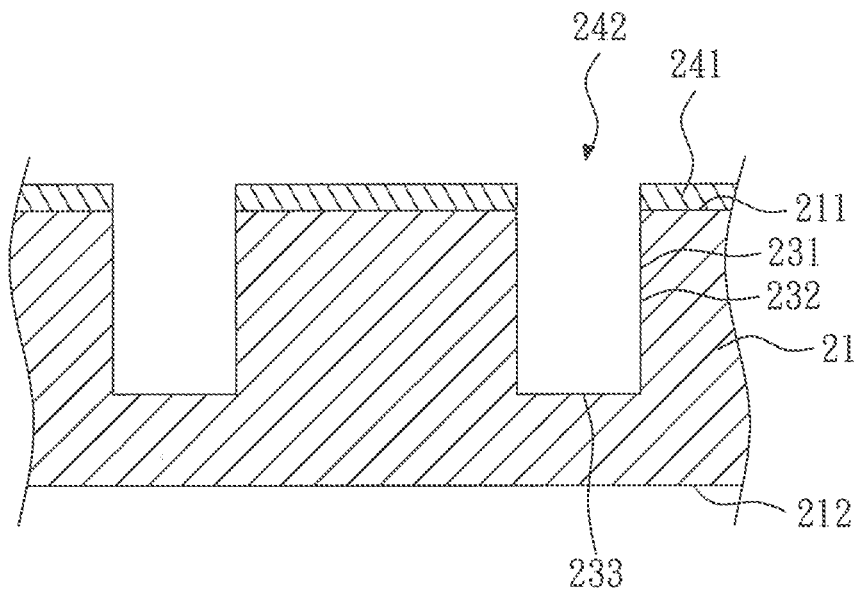

Referring to FIG. 6, the groove 231 is formed on the substrate 21 by etching according to the first opening 242. The groove 231 is disposed on the first surface 211 of the substrate 21, and has the side wall 232 and the bottom wall 233. The first photo resist layer 241 is then removed.

Figure 7:
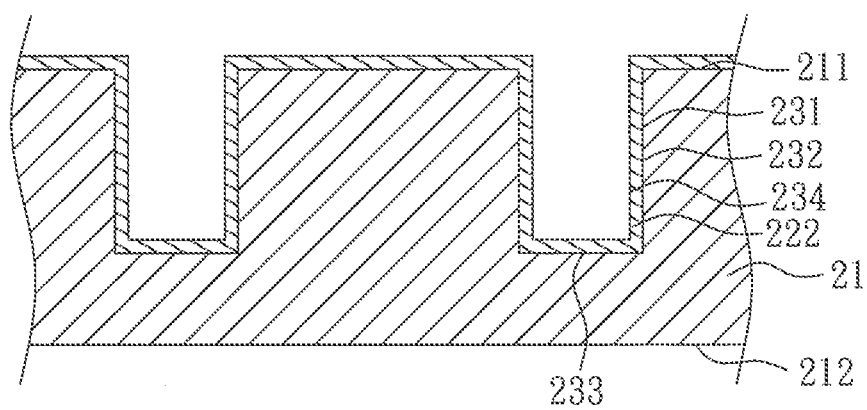

Referring to FIG. 7, a first conductive metal 222 is formed on the side wall 232 and the bottom wall 233 of the groove 231 and the first surface 211 of the substrate 21 by electroplating, so as to form a central groove 234. In the embodiment, the material of the first conductive metal 222 is copper.

Afterward, referring to FIGS. 8 to 12, a center insulating material 223 is formed in the central groove 234. In the embodiment, the center insulating material 223 is a polymer 263. In the present invention, the method for forming the center insulating material 223 in the central groove 234 includes but is not limited to the following three methods.

Figure 8:
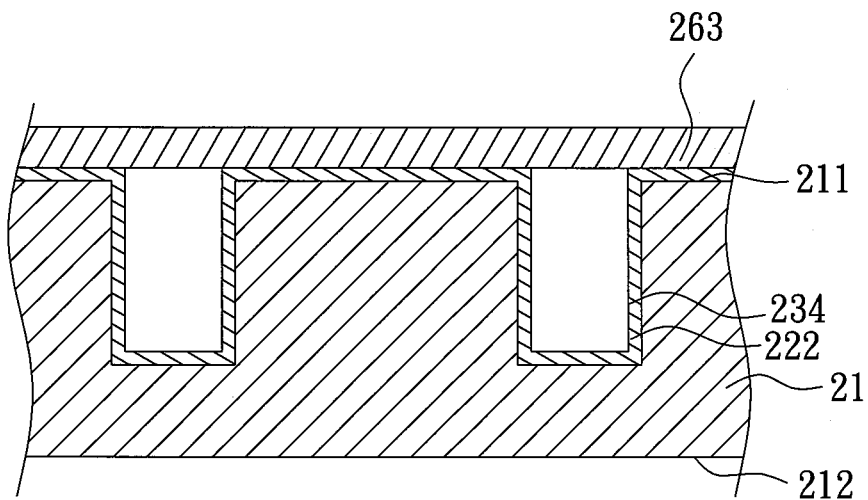
Figure 9:
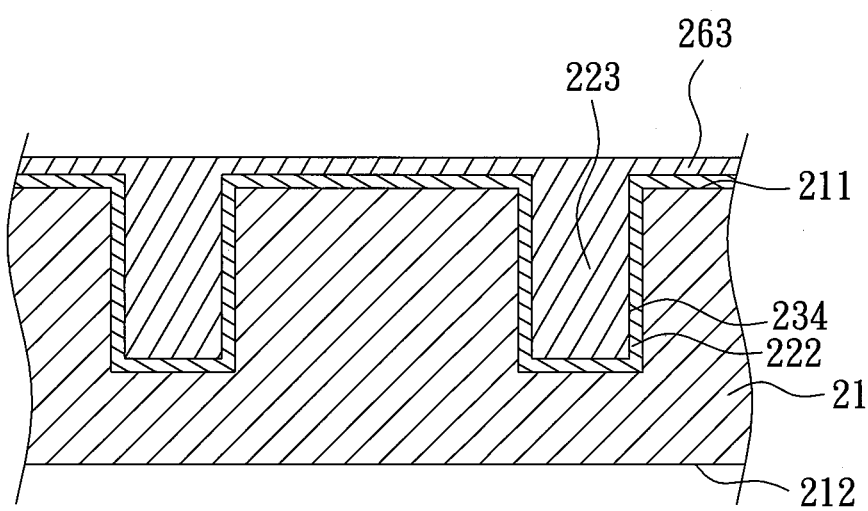

The first method is that the polymer 263 is dispersed on the first surface 211 of the substrate 21, and the position of the polymer 263 corresponds to the central groove 234, as shown in FIG. 8. Alternatively, the polymer 263 can be partially dispersed at a position corresponding to the central groove 234. Afterward, the polymer 263 is impelled into the central groove 234 by vacuuming so as to form the center insulating material 223, as shown in FIG. 9.

Figure 10:
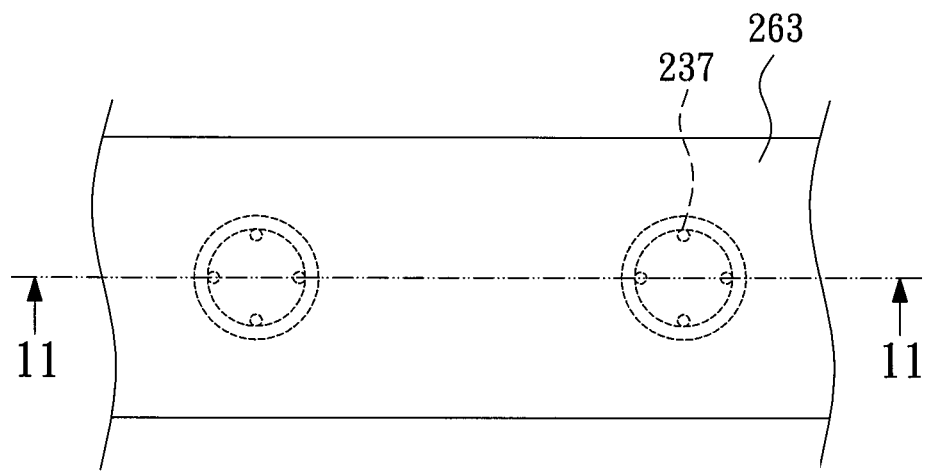
Figure 11:
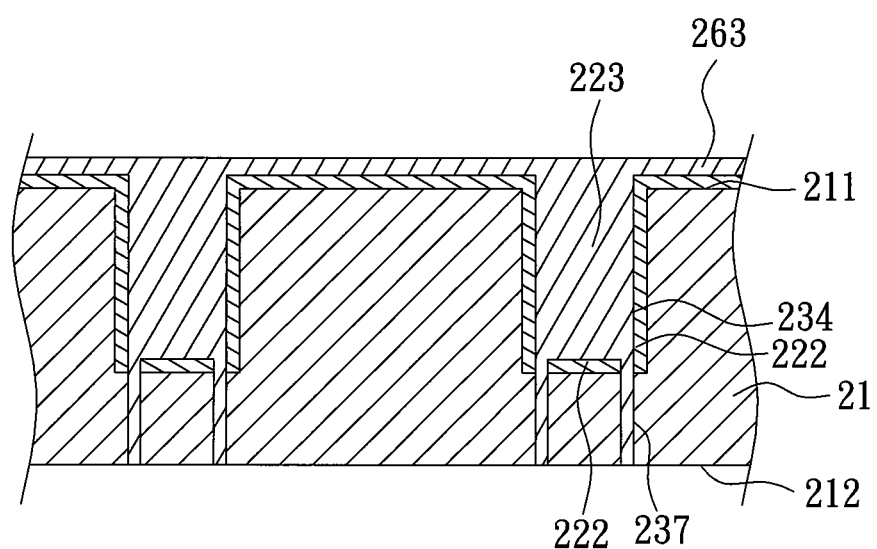

The second method is that a plurality of first vents 237 are formed to connect the central groove 234 to the second surface 212 of the substrate 21, as shown in FIG. 10, a top view of the substrate 21, and FIG. 11, a cross-sectional view along line 11-11 in FIG. 10. Afterward, the polymer 263 is dispersed on the first surface 211 of the substrate 21, and the position of the polymer 263 corresponds to the central groove 234. Alternatively, the polymer 263 can be partially dispersed at a position corresponding to the central groove 234. The central groove 234 and the first vents 237 are then filled with the polymer 263 so as to form the center insulating material 223.

Figure 12:
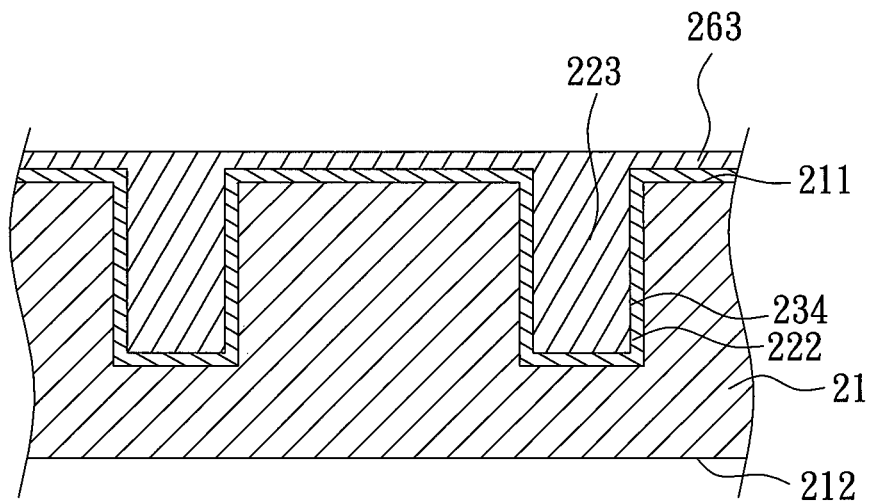

The third method is that the polymer 263 is atomized and deposited in the central groove 234 by spray coating so as to form the center insulating material 223, as shown in FIG. 12.

Figure 13:
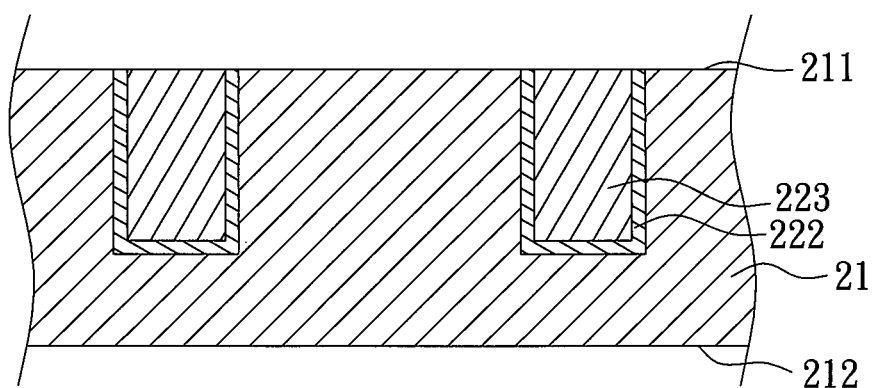

Afterward, referring to FIG. 13, the first conductive metal 222 and the center insulating material 223 disposed on the first surface 211 of the substrate 21 are removed by etching or grinding.

Figure 14:
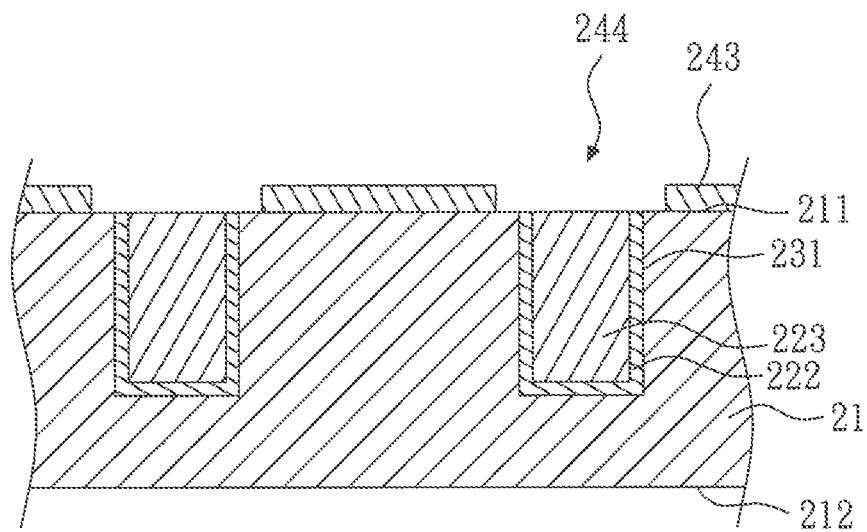
Figure 15:
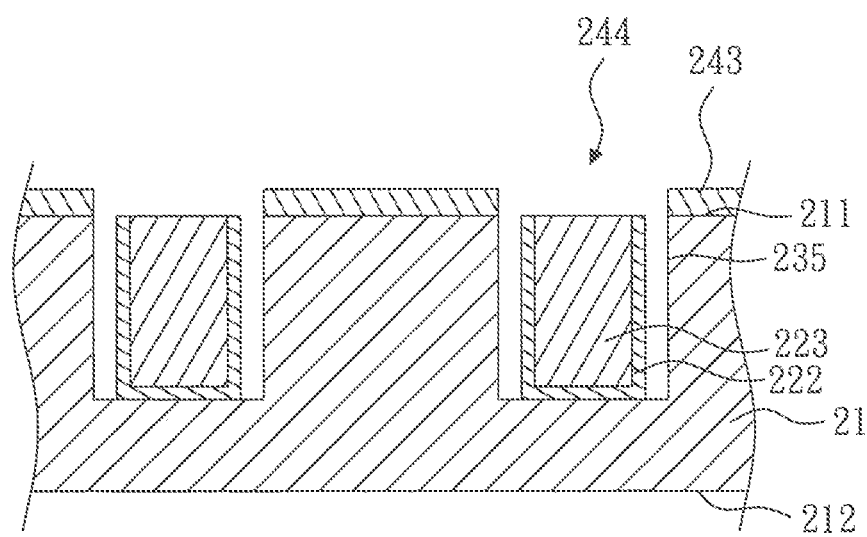

Referring to FIGS. 14 and 15, an annular groove 235 is formed on the first surface 211 of the substrate 21. The annular groove 235 surrounds the first conductive metal 222. Referring to FIG. 14, in the embodiment, a second photo resist layer 243 is formed on the first surface 211 of the substrate 21, and a second opening 244 is formed on the second photo resist layer 243. The position of the second opening 244 corresponds to the groove 231, and the diameter of the second opening 244 is larger than that of the groove 231. Afterward, referring to FIG. 15, the annular groove 235 is formed on the substrate 21 by etching according to the second opening 244. The annular groove 235 surrounds the first conductive metal 222, and does not penetrate the substrate 21. The second photo resist layer 243 is then removed.

Referring to FIGS. 16 to 20, a first insulating material 221 is formed in the annular groove 235. In the embodiment, the first insulating material 221 is polymer 261. In the present invention, the method for forming the first insulating material 221 in the annular groove 235 includes but is not limited to the following three methods.

Figure 16:
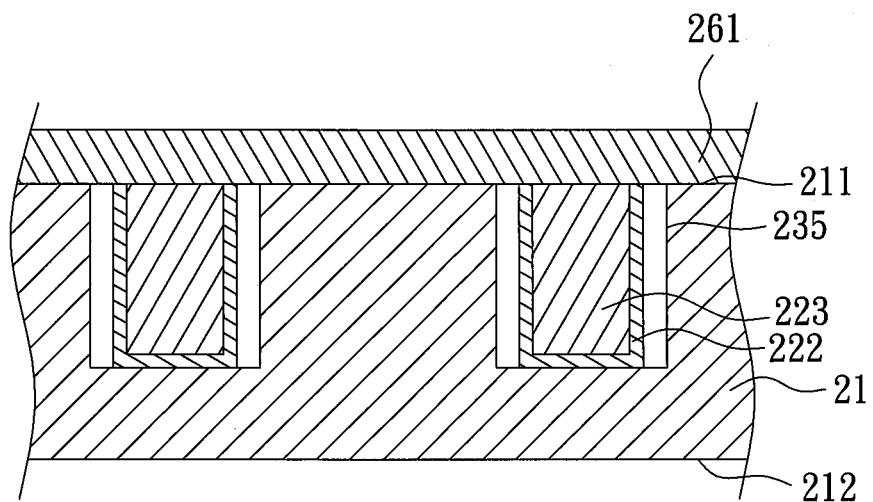
Figure 17:
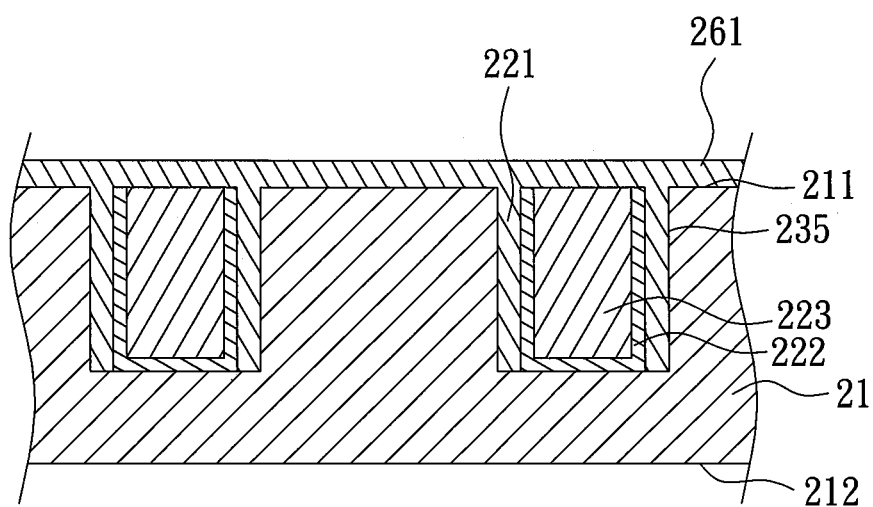

The first method is that the polymer 261 is dispersed on the first surface 211 of the substrate 21, and the position of the polymer 261 corresponds to the annular groove 235, as shown in FIG. 16. Alternatively, the polymer 261 can be partially dispersed at a position corresponding to the annular groove 235. Afterward, the polymer 261 is impelled into the annular groove 235 by vacuuming so as to form the first insulating material 221, as shown in FIG. 17.

Figure 18:
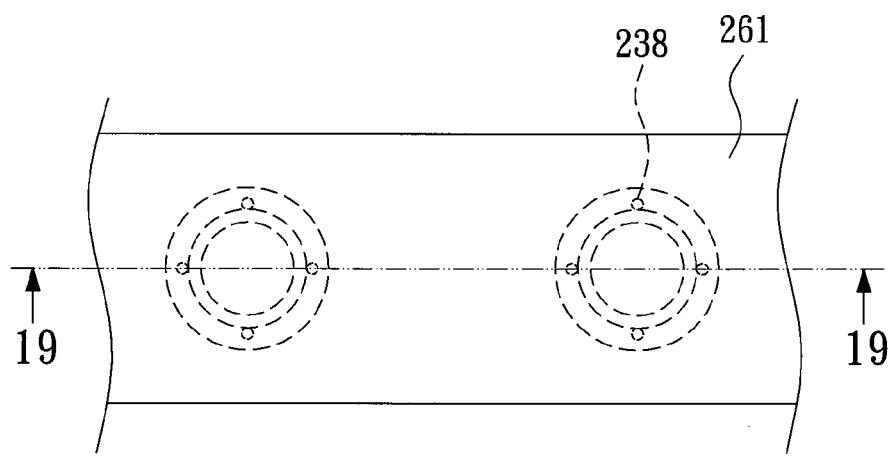
Figure 19:
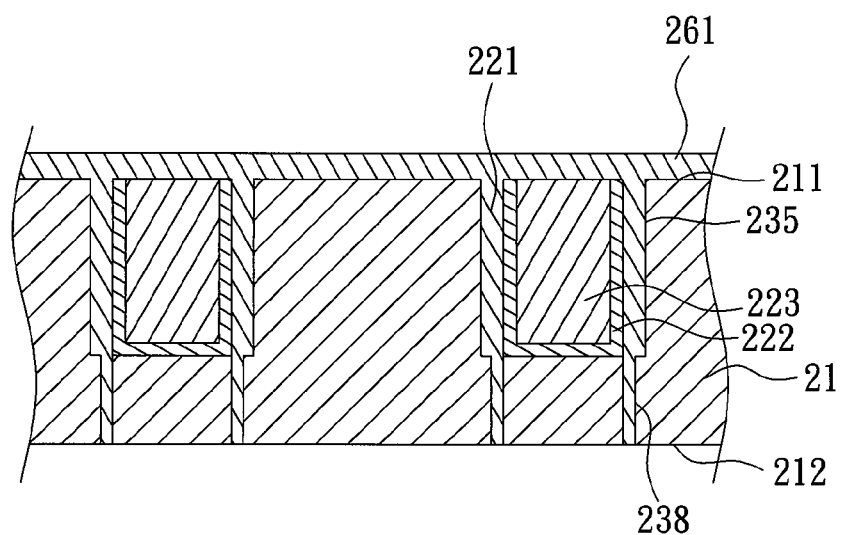

The second method is that a plurality of second vents 238 are formed to connect the annular groove 235 to the second surface 212 of the substrate 21, as shown in FIG. 18, a top view of the substrate 21, and FIG. 19, a cross-sectional view along line 19-19 in FIG. 18. Afterward, the polymer 261 is dispersed on the first surface 211 of the substrate 21, and the position of the polymer 261 corresponds to the annular groove 235. Alternatively, the polymer 261 can be partially dispersed at a position corresponding to the annular groove 235. The annular groove 235 and the second vents 238 are then filled with the polymer 261 so as to form the first insulating material 221.

Figure 20:
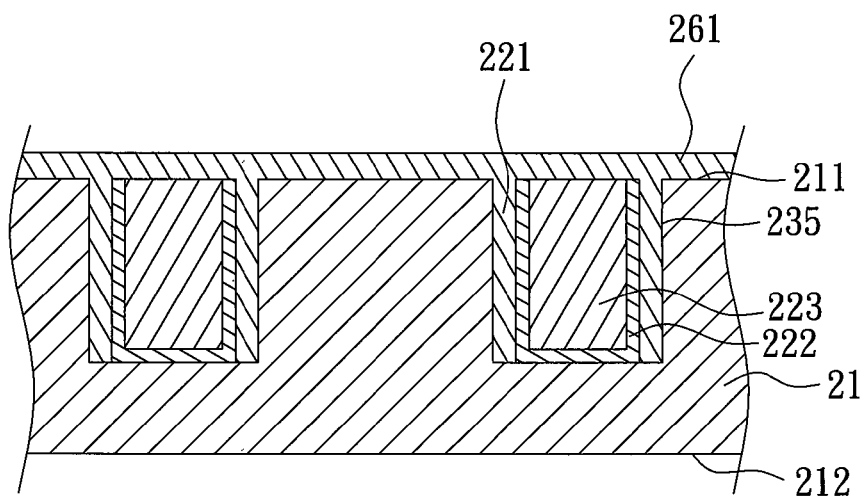

The third method is that the polymer 261 is atomized and deposited in the annular groove 235 by spray coating so as to form the first insulating material 221, as shown in FIG. 20.

Figure 21:
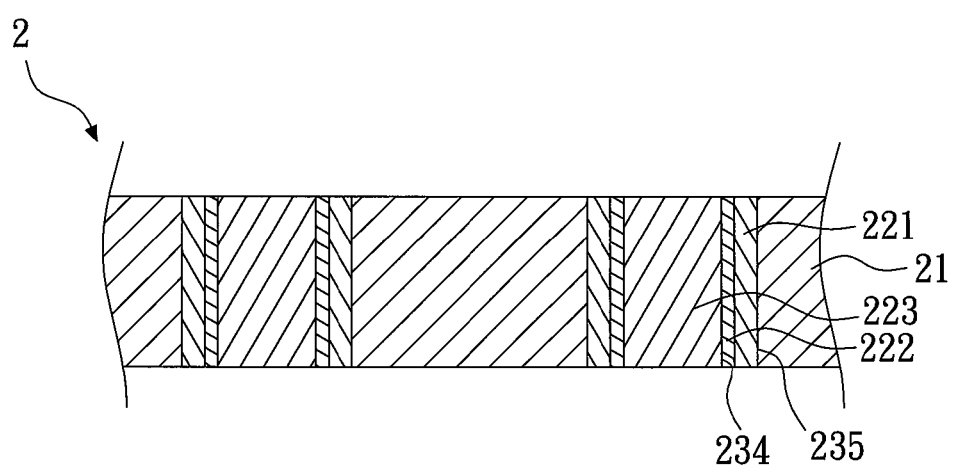

Afterward, referring to FIG. 21, part of the first surface 211 and part of the second surface 212 of the substrate 21 are removed by etching or grinding so as to expose the first conductive metal 222, the center insulating material 223 and the first insulating material 221. A substrate 2 with a via according to the first embodiment of the present invention is formed. In the embodiment, the via is formed by the center insulating material 223, the first conductive metal 222 and the first insulating material 221. In the present invention, thicker insulating material (the center insulating material 223 and the first insulating material 221) can be formed in the central groove 234 and the annular groove 235 of the via. Also, the thickness of the insulating material in the central groove 234 and the annular groove 235 of the via is even. Moreover, the polymer is used as an insulating material in the present invention, so polymers with different materials can be chosen for specific processes.

Figure 22:
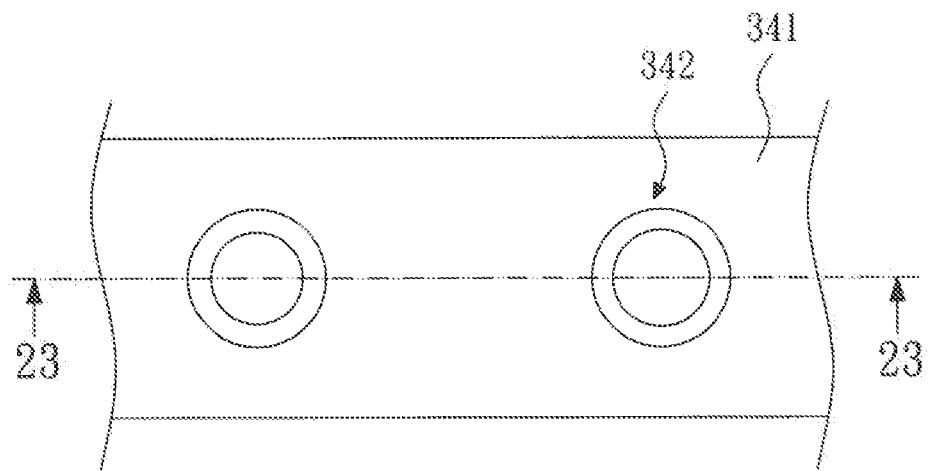
FIGS. 22 to 39 are schematic views of a method for forming a via in a substrate according to a second embodiment of the present invention.

FIGS. 22 to 39 show schematic views of a method for forming a via in a substrate according to a second embodiment of the present invention. Referring to FIG. 22, a top view of the substrate, and FIG. 23, a cross-sectional view along line 23-23 in FIG. 22, first, a substrate 31 is provided. The substrate 31 has a first surface 311 and a second surface 312. The substrate 31 is, for example, a wafer or a silicon substrate. Afterward, referring to FIG. 24, an annular groove 335 and a pillar 336 are formed on the first surface 311 of the substrate 31, and the annular groove 335 surrounds the pillar 336.

Figure 23:
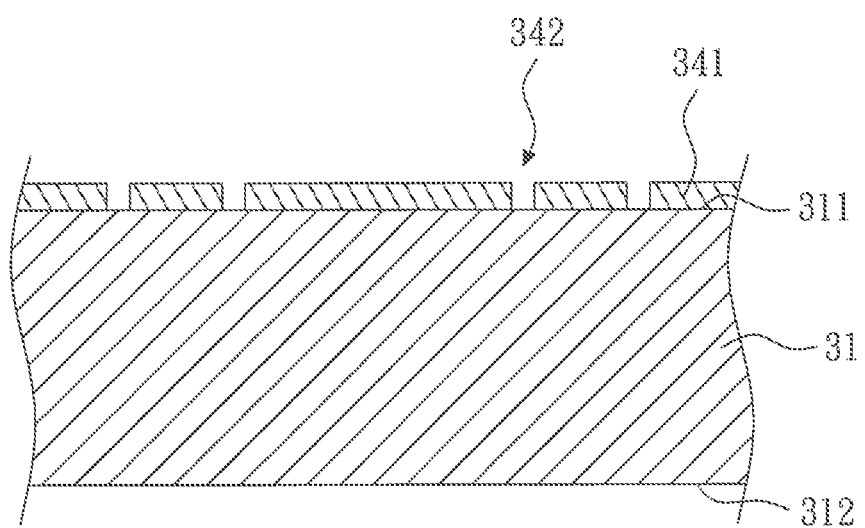
Figure 24:
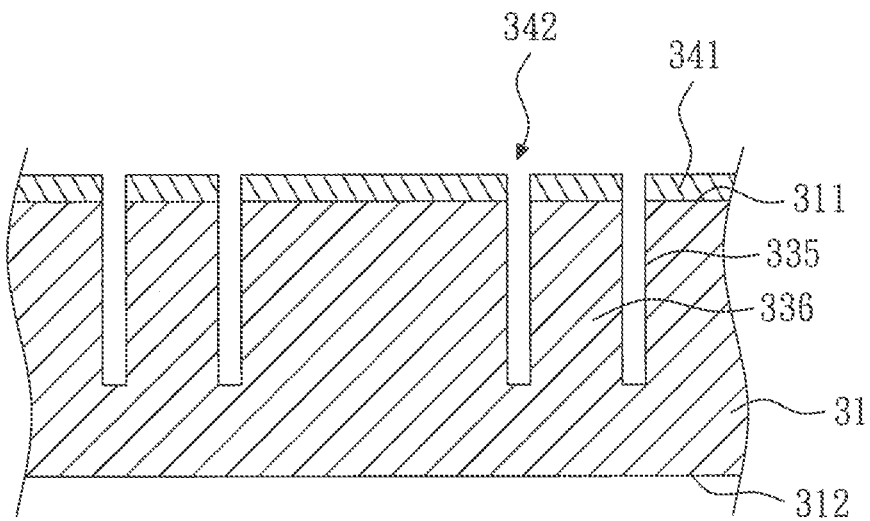

In the embodiment, a first photo resist layer 341 is formed on the first surface 311 of the substrate 31, a first pattern 342 is formed on the first photo resist layer 341, and the first pattern 342 is an annular opening, as shown in FIGS. 22 and 23. Referring to FIG. 24, the annular groove 335 and the pillar 336 are formed on the substrate 31 by etching according to the first pattern 342. The annular groove 335 surrounds the pillar 336, and the annular groove 335 does not penetrate the substrate 31. The first photo resist layer 341 is then removed.

Referring to FIGS. 25 to 29, a first insulating material 321 is formed in the annular groove 335. In the embodiment, the first insulating material 321 is polymer 361. In the present invention, the method for forming the first insulating material 321 in the annular groove 335 includes but is not limited to the following three methods.

Figure 25:
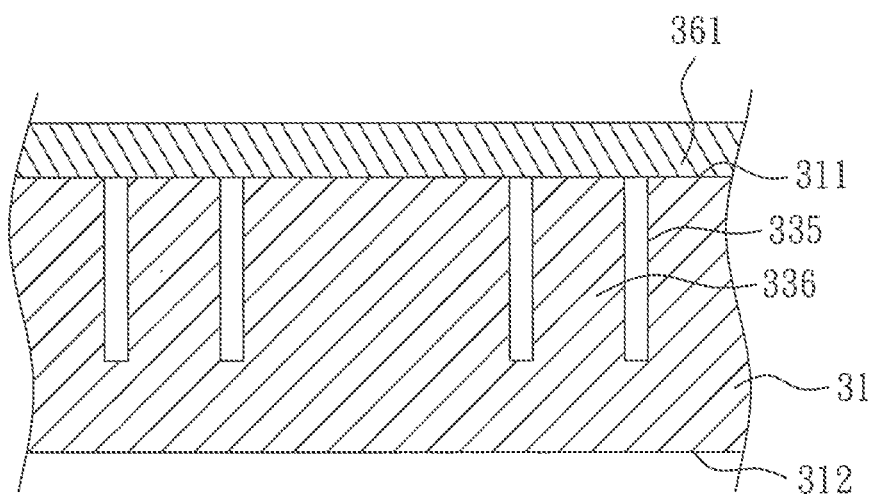
Figure 26:
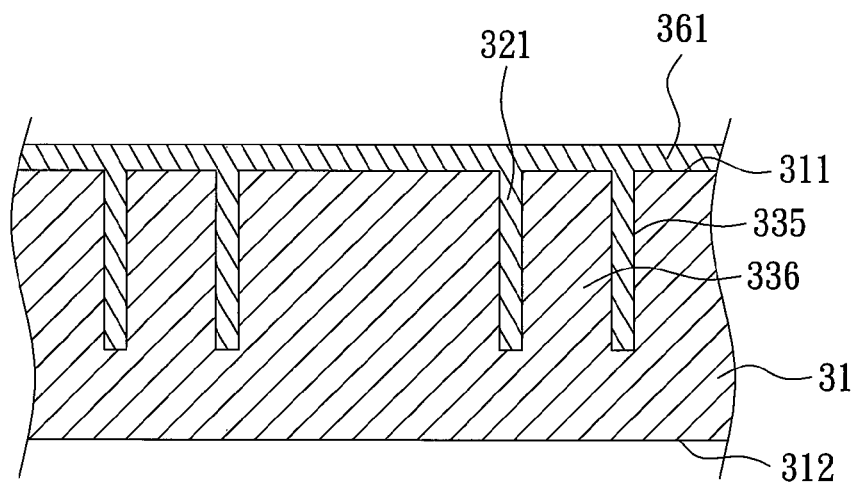

The first method is that the polymer 361 is dispersed on the first surface 311 of the substrate 31, and the position of the polymer 361 corresponds to the annular groove 335, as shown in FIG. 25. Alternatively, the polymer 361 can be partially dispersed at a position corresponding to the annular groove 335. Afterward, the polymer 361 is impelled into the annular groove 335 by vacuuming so as to form the first insulating material 321, as shown in FIG. 26. Finally, part of the polymer 361 which is outside the annular groove 335 is removed.

Figure 27:
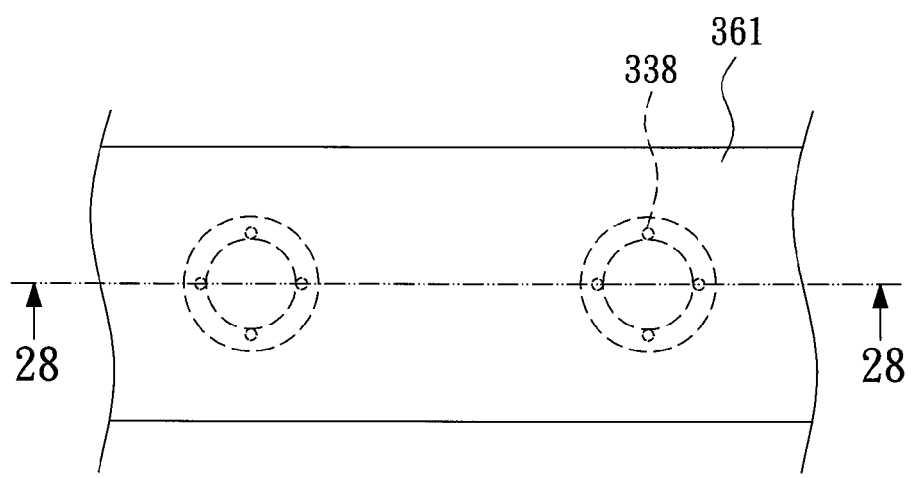
Figure 28:
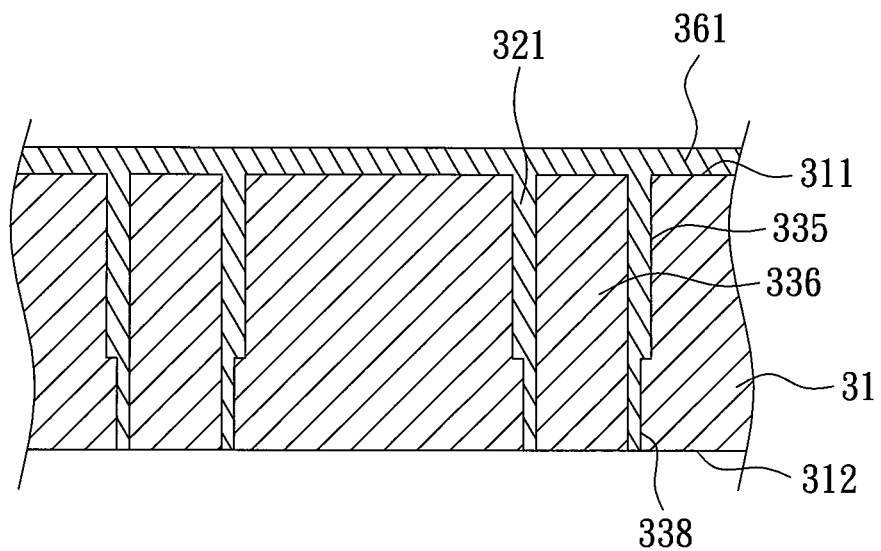

The second method is that a plurality of second vents 338 are formed to connect the annular groove 335 to the second surface 312 of the substrate 31, as shown in FIG. 27, a top view of the substrate 31, and FIG. 28, a cross-sectional view along line 28-28 in FIG. 27. Afterward, the polymer 361 is dispersed on the first surface 311 of the substrate 31, and the position of the polymer 361 corresponds to the annular groove 335. Alternatively, the polymer 361 can be partially dispersed at a position corresponding to the annular groove 335. The annular groove 335 and the second vents 338 are then filled with the polymer 361 so as to form the first insulating material 321. Finally, part of the polymer 361 which is outside the annular groove 335 and the second vents 338 is removed.

Figure 29:
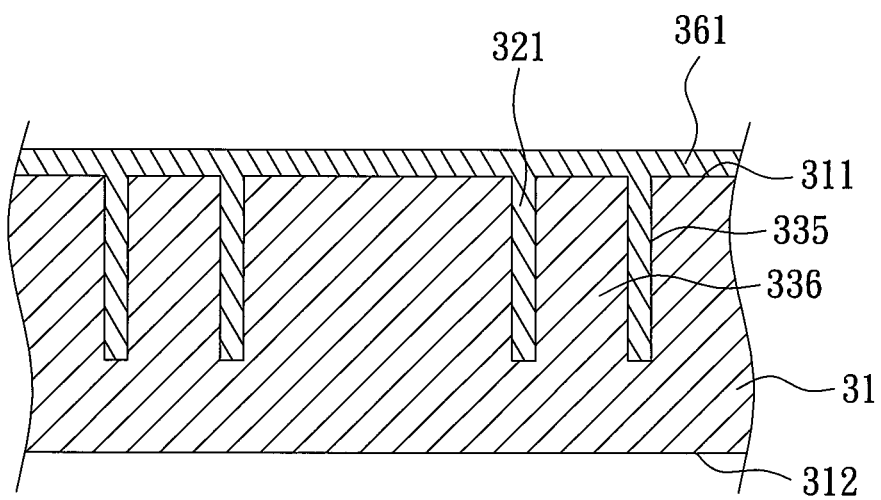
Figure 30:
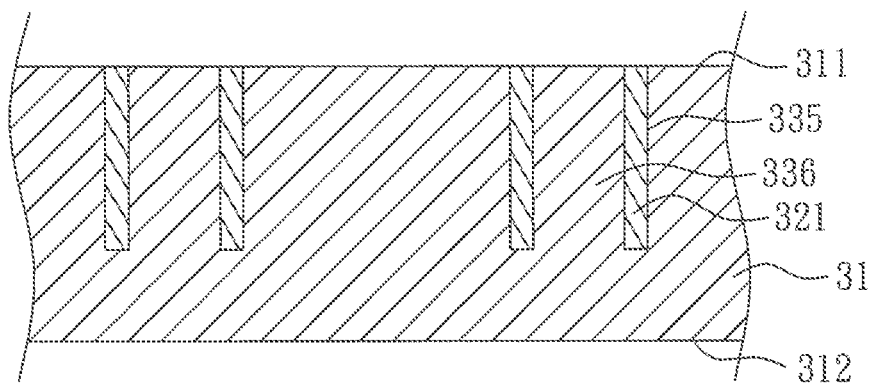

The third method is that the polymer 361 is atomized and deposited in the annular groove 335 by spray coating so as to form the first insulating material 321, as shown in FIG. 29. Referring to FIG. 30, part of the polymer 361 which is outside the annular groove 335 is removed.

Figure 31:
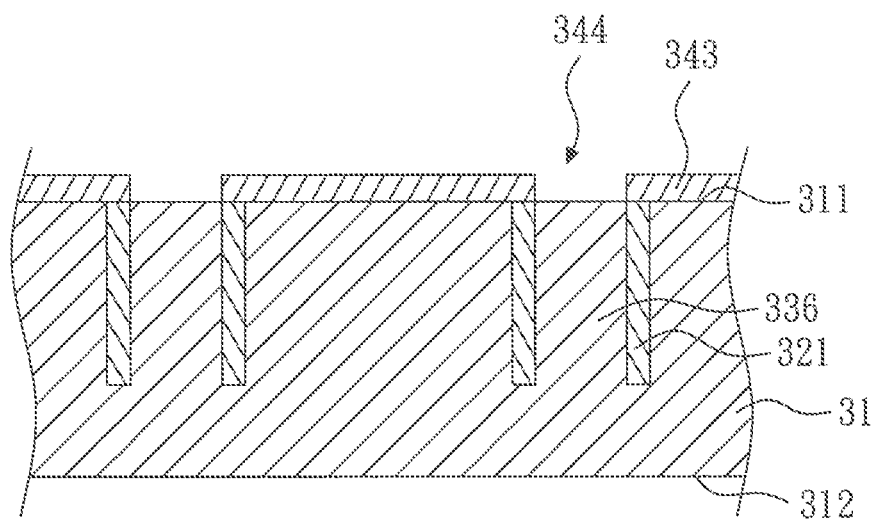
Figure 32:
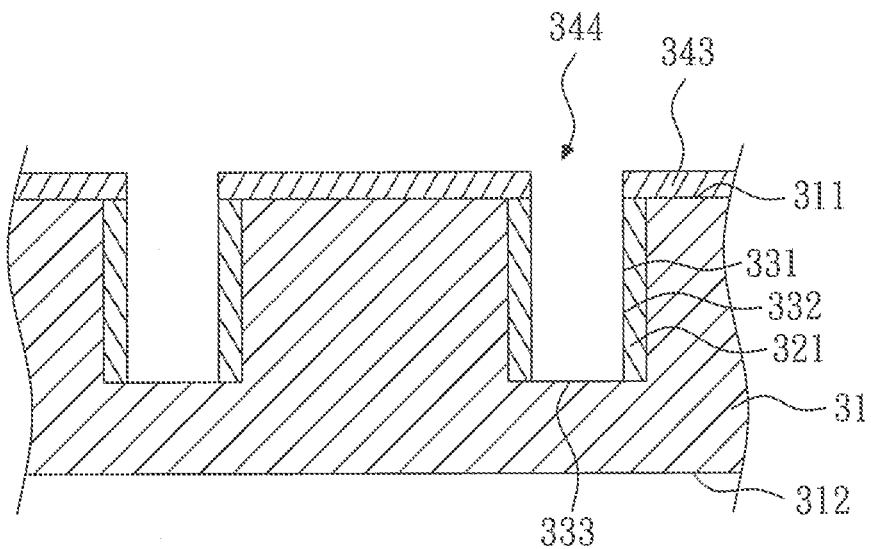

Referring to FIGS. 31 and 32, the pillar 336 of the substrate 31 is removed so as to form a groove 331 on the substrate 31. The groove 331 has a side wall 332 and a bottom wall 333. In the embodiment, referring to FIG. 31, a second photo resist layer 343 is formed on the first surface 311 of the substrate 31. A second opening 344 is formed on the second photo resist layer 343, and the position of the second opening 344 corresponds to the pillar 336. Afterward, the pillar 336 is removed by dry etching or wet etching according to the second opening 344, so as to form the groove 331. The groove 331 has the side wall 332 and the bottom wall 333. The second photo resist layer 343 is then removed immediately or in a subsequent step.

Figure 33:
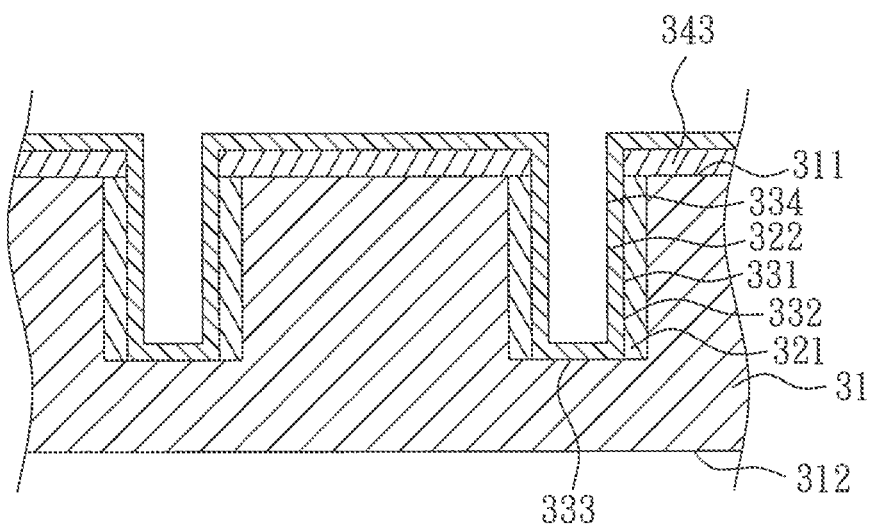

Referring to FIG. 33, a conductive metal 322 is formed on the side wall 332 and the bottom wall 333 of the groove 331 by electroplating, so as to form a central groove 334. In the embodiment, the material of the first conductive metal 322 is copper. Part of the first conductive metal 322 which is outside the groove 331 is then removed immediately or in a subsequent step.

Afterward, referring to FIGS. 34 to 38, a center insulating material 323 is formed in the central groove 334. In the embodiment, the center insulating material 323 is a polymer 363. In the present invention, the method for forming the center insulating material 323 in the central groove 334 includes but is not limited to the following three methods.

Figure 34:
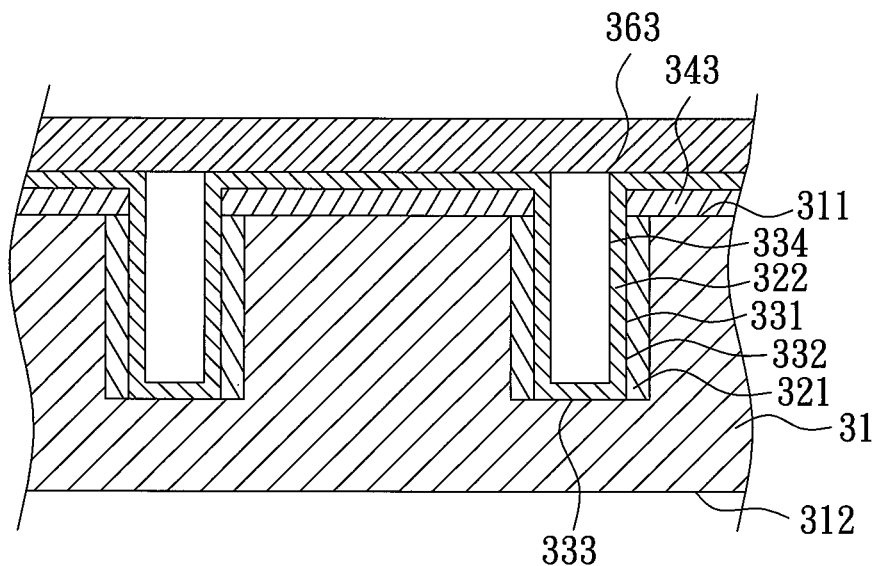
Figure 35:
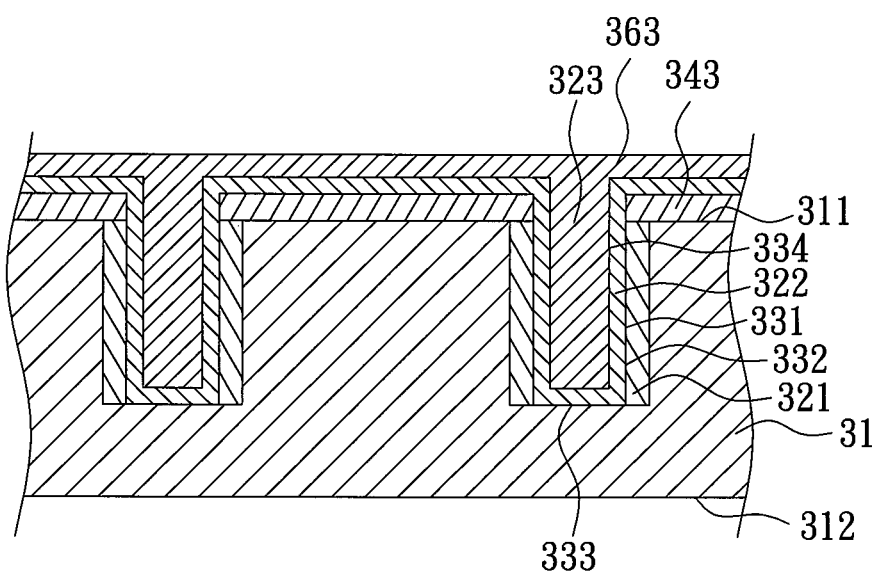

The first method is that the polymer 363 is dispersed on the first surface 311 of the substrate 31, and the position of the polymer 363 corresponds to the central groove 334, as shown in FIG. 34. Alternatively, the polymer 363 can be partially dispersed at a position corresponding to the central groove 334. Afterward, the polymer 363 is impelled into the central groove 334 by vacuuming so as to form the center insulating material 323, as shown in FIG. 35.

Figure 36:
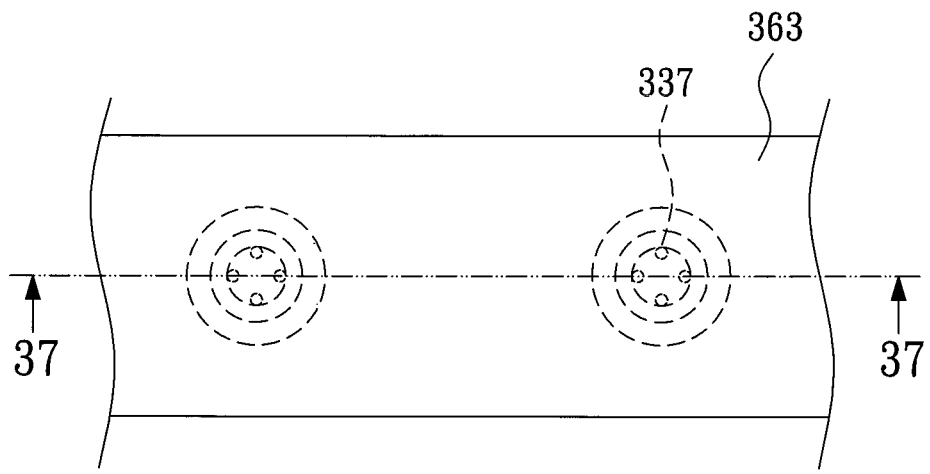
Figure 37:
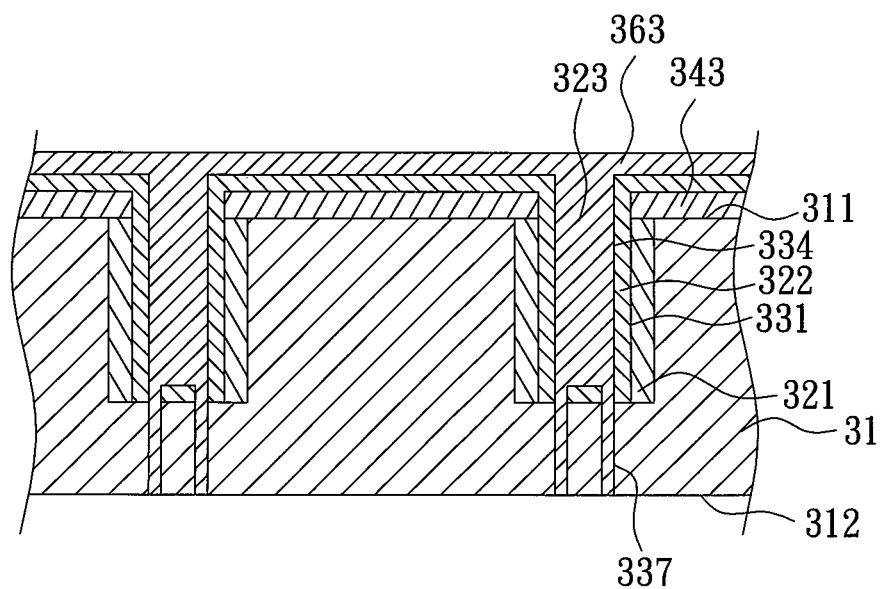

The second method is that a plurality of first vents 337 are formed to connect the central groove 334 to the second surface 312 of the substrate 31, as shown in FIG. 36, a top view of the substrate 31, and FIG. 37, a cross-sectional view along line 37-37 in FIG. 36. Afterward, the polymer 363 is dispersed on the first surface 311 of the substrate 31, and the position of the polymer 363 corresponds to the central groove 334. Alternatively, the polymer 363 can be partially dispersed at a position corresponding to the central groove 334. The central groove 334 and the first vents 337 are then filled with the polymer 363 so as to form the center insulating material 323.

Figure 38:
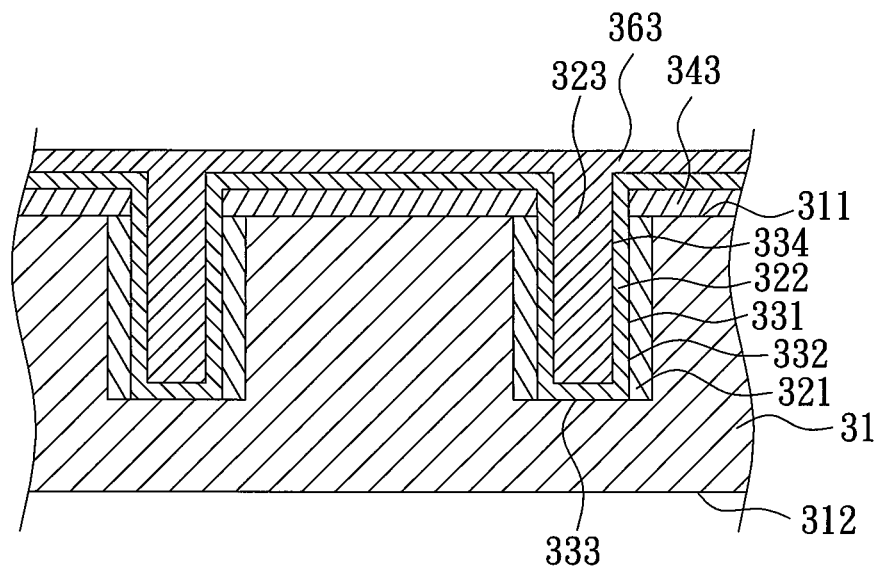

The third method is that the polymer 363 is atomized and deposited in the central groove 334 by spray coating so as to form the center insulating material 323, as shown in FIG. 38.

Figure 39:
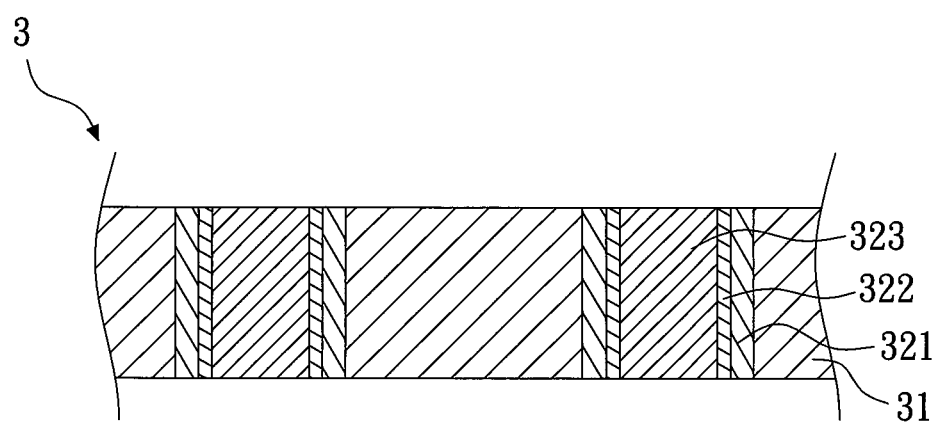

Afterward, referring to FIG. 39, part of the first surface 311 and part of the second surface 312 of the substrate 31 are removed by etching or grinding so as to expose the first conductive metal 322, the center insulating material 323 and the first insulating material 321. A substrate 3 with a via according to the second embodiment of the present invention is formed.

Figure 40:
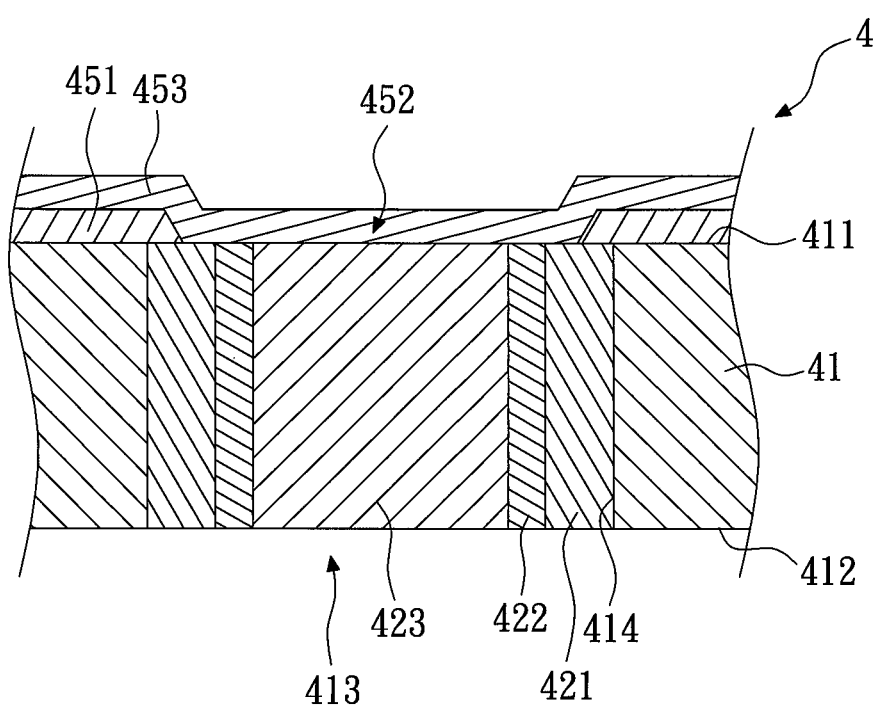
FIG. 40 is a schematic view of a substrate with a via according to a third embodiment of the present invention.

FIG. 40 shows a schematic view of a substrate with a via according to a third embodiment of the present invention. The substrate 4 with a via comprises a substrate 41, a first insulating material 421, a center insulating material 423 and a first conductive metal 422.

The substrate 41 has a first surface 411, a second surface 412 and a via 413. The via 413 penetrates the substrate 41, and has an inner side wall 414. The first insulating material 421 is a hollow pillar disposed on the inner side wall 414 of the via 413. The center insulating material 423 is a solid pillar, disposed at the center of the via 413, and spaced from the first insulating material 421. The first conductive metal 422 is disposed between the first insulating material 421 and the center insulating material 423, and surrounds the center insulating material 423 so as to form a hollow pillar. In the embodiment, the first insulating material 421 contacts the first conductive metal 422, and the center insulating material 423 contacts the first conductive metal 422. That is, a three-layered structure with insulating material and conductive material in alternate layers is formed in the via 413, and the structure includes the center insulating material 423, the first conductive metal 422 and the first insulating material 421 from the center to the edge. The center insulating material 423 and the first insulating material 421 may be the same or different.

The substrate 4 with a via further comprises a passivation layer 451 and a conducting layer 453. The passivation layer 451 is disposed on the first surface 411 or the second surface 412 of the substrate 41. In the embodiment, the passivation layer 451 is disposed on the first surface 411 of the substrate 41. The passivation layer 451 has an opening 452, so that the passivation layer 451 covers part of the first insulating material 421 and exposes part of the first insulating material 421. The conducting layer 453 is disposed on the passivation layer 451, and covers part of the first insulating material 421, the first conductive metal 422 and the center insulating material 423.

Figure 41:
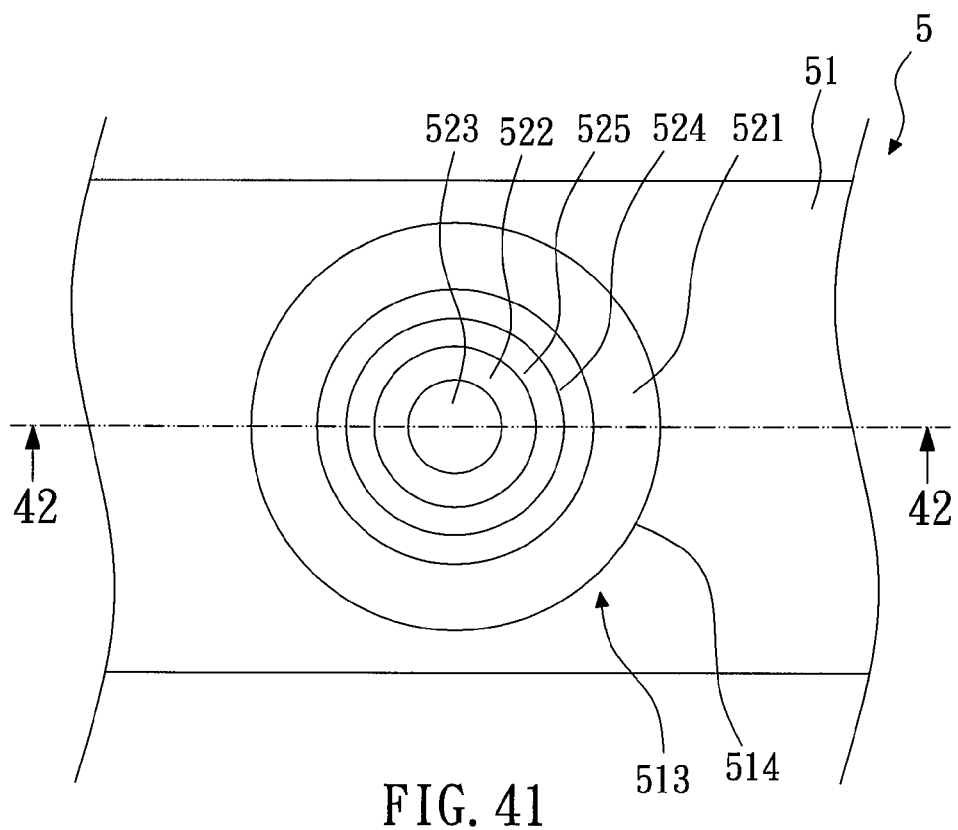
FIGS. 41 and 42 are schematic views of a substrate with a via according to a fourth embodiment of the present invention.
Figure 42:
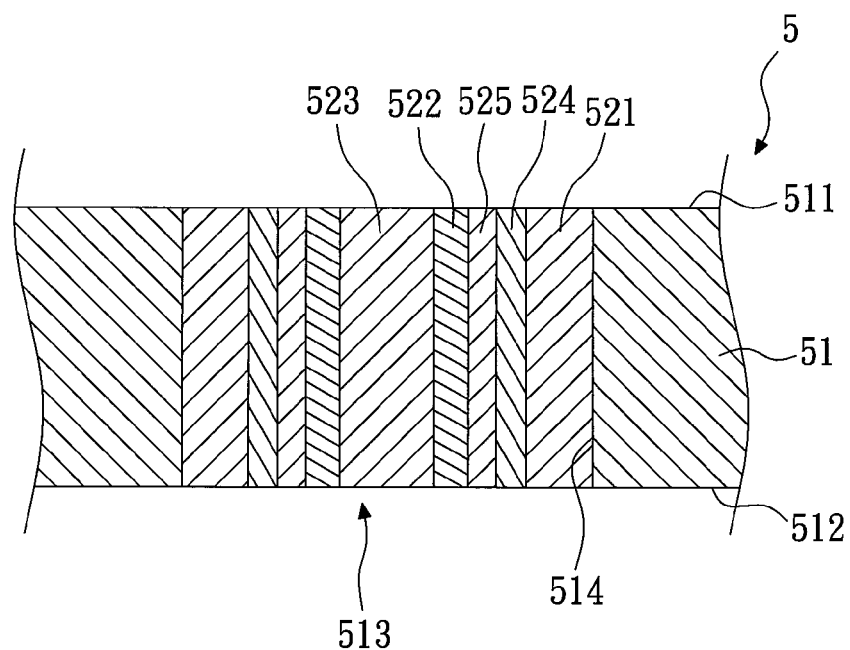

FIGS. 41 and 42 show schematic views of a substrate with a via according to a fourth embodiment of the present invention. FIG. 41 is a top view of the substrate, and FIG. 42 is a cross-sectional view along line 42-42 in FIG. 41. The substrate 5 with a via comprises a substrate 51, a first insulating material 521, a center insulating material 523, a first conductive metal 522, a second insulating material 525 and a second conductive metal 524.

The substrate 51 has a first surface 511, a second surface 512 and a via 513. The via 513 penetrates the substrate 51, and has an inner side wall 514. The first insulating material 521 is a hollow pillar disposed on the inner side wall 514 of the via 513. The center insulating material 523 is a solid pillar, disposed at the center of the via 513, and spaced from the first insulating material 521. The first conductive metal 522 is disposed between the center insulating material 523 and the second insulating material 525, and surrounds the center insulating material 523 so as to form a hollow pillar. The second insulating material 525 is disposed between the first conductive metal 522 and the second conductive metal 524, and surrounds the first conductive metal 522 so as to form a hollow pillar. The second conductive metal 524 is disposed between the second insulating material 515 and the first insulating material 521, and surrounds the second insulating material 525 so as to form a hollow pillar. In the embodiment, the second insulating material 525 contacts the first conductive metal 522, the second conductive metal 524 contacts the second insulating material 525, and the second conductive metal 524 contacts the first insulating material 521. That is, a five-layered structure with insulating material and conductive material in alternate layers is formed in the via 513, and the structure includes the center insulating material 523, the first conductive metal 522, the second insulating material 525, the second conductive metal 524 and the first insulating material 521 from the center to the edge. The center insulating material 523, the first insulating material 521 and the second insulating material 525 may be the same or different. The material of the first conductive metal 522 and the second conductive metal 524 may be the same or different.

Moreover, it is understood that, in the substrate 5 with a via, more layers of insulating material and conductive metal can be placed between the center insulating material 523 and the first insulating material 521, so as to form a multi-layered structure with insulating material and conductive material in alternate layers.

Figure 43:
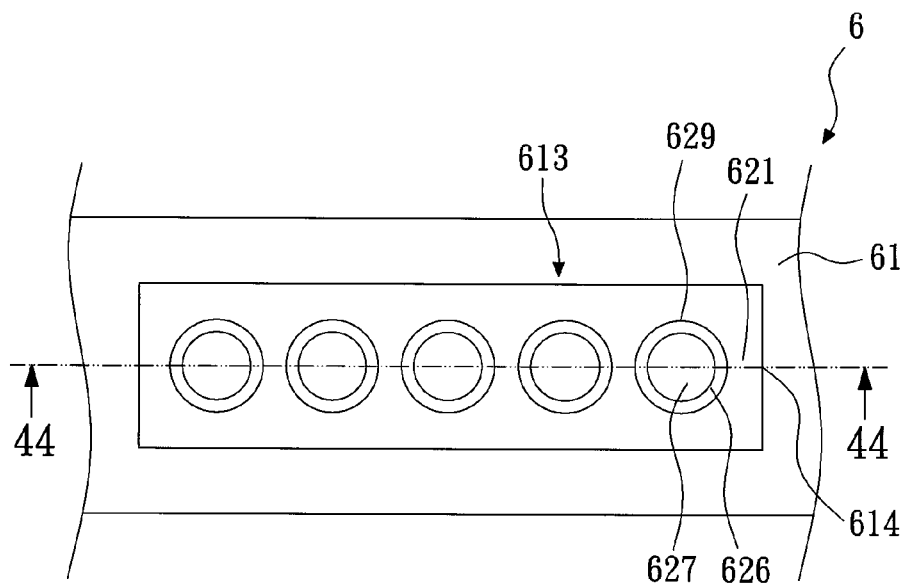
FIGS. 43 and 44 are schematic views of a substrate with a via according to a fifth embodiment of the present invention.
Figure 44:
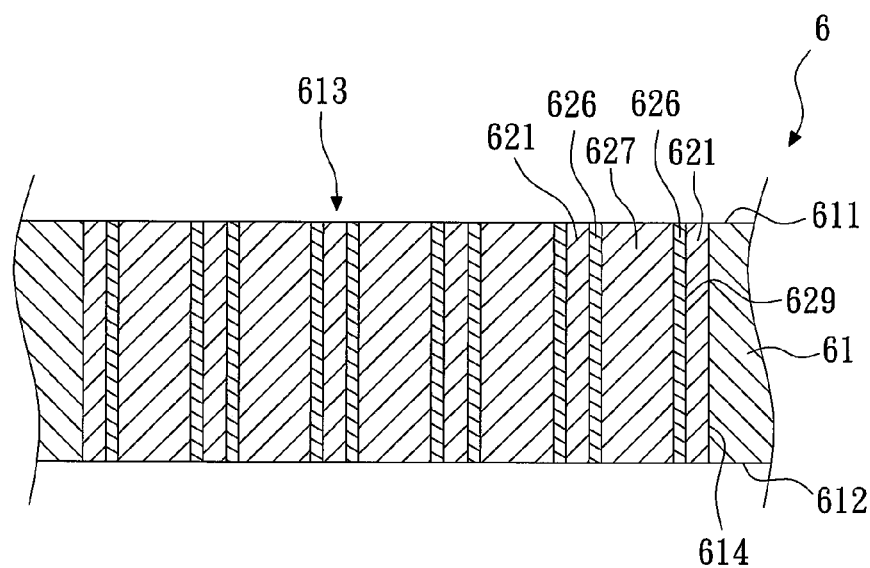

FIGS. 43 and 44 show schematic views of a substrate with a via according to a fifth embodiment of the present invention. FIG. 43 is a top view of the substrate, and FIG. 44 is a cross-sectional view along line 44-44 in FIG. 43. The substrate 6 with a via comprises a substrate 61, a first insulating material 621 and a plurality of grooves 629.

The substrate 61 has a first surface 611, a second surface 612 and a via 613. The via 613 penetrates the substrate 61, and has an inner side wall 614. The first insulating material 621 is disposed in the via 613, and attached to the inner side wall 614 of the via 613. The grooves 629 are disposed in the first insulating material 621. Each of the grooves 629 penetrates the first insulating material 621, and comprises a third insulating material 627 and a third conductive metal 626. The third insulating material 627 is a solid pillar, and disposed at the center of the grooves 629. The third conductive metal 626 surrounds and contacts the third insulating material 627, and contacts the first insulating material 621. The first insulating material 621 and the third insulating material 627 may be the same or different.

Moreover, it is understood that, in the substrate 6 with a via, more layers of insulating material and conductive metal may be placed between the third insulating material 627 and the third conductive metal 626 of each of the grooves 629, or between the third conductive metal 626 and the first insulating material 621 of each of the grooves 629, so as to form a multi-layered structure with insulating material and conductive material in alternate layers.

The substrate 6 with a via further comprises a passivation layer (not shown) and a conducting layer (not shown). The passivation layer is disposed on the first surface 611 or the second surface 612 of the substrate 61, and has a plurality of openings. The position of each of the openings of the passivation layer corresponds to each of the grooves 629, and the diameter of each of the openings of the passivation layer is larger than that of each of the grooves 629, so that the passivation layer covers part of the first insulating material 621 and exposes part of the first insulating material 621. The conducting layer is disposed on the passivation layer, and covers part of the first insulating material 621, the third conductive metal 626 and the third insulating material 627.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined in the appended claims.

What is claimed is:

1. A method for forming a via in a substrate, comprising the following steps in the sequence set forth:
   (a) providing a substrate having a first surface and a second surface;
   (b) forming a groove that has a side wall and a bottom wall on the first surface of the substrate;
   (c) forming a first conductive metal on the side wall and the bottom wall of the groove so as to form a central groove;
   (d) forming a center insulating material in the central groove;
   (e) forming an annular groove that surrounds the first conductive metal on the first surface of the substrate;
   (f) forming a first insulating material in the annular groove; and
   (g) removing part of the second surface of the substrate to expose the first conductive metal, the center insulating material and the first insulating material.

2. The method as claimed in claim 1, wherein in Step (a), the substrate is a silicon substrate.

3. The method as claimed in claim 1, wherein in Step (a), the substrate is a wafer.

4. The method as claimed in claim 1, wherein Step (b) comprises:
   (b1) forming a first photo resist layer on the first surface of the substrate;
   (b2) forming a first opening on the first photo resist layer; and
   (b3) forming the groove on the substrate according to the first opening.

5. The method as claimed in claim 4, further comprising a step of removing the first photo resist layer after Step (b3).

6. The method as claimed in claim 1, wherein in Step (b), the groove is formed by etching.

7. The method as claimed in claim 1, wherein in Step (c), the first conductive metal is formed in the groove by electroplating.

8. The method as claimed in claim 1, wherein Step (d) comprises:
   (d1) dispersing a polymer at a position corresponding to the central groove; and
   (d2) impelling the polymer into the central groove by vacuuming so as to form the center insulating material.

9. The method as claimed in claim 1, wherein Step (d) comprises:
   (d1) forming a plurality of first vents so as to connect the central groove to the second surface of the substrate;
   (d2) dispersing a polymer at a position corresponding to the central groove; and
   (d3) filling the central groove and the first vents with the polymer so as to form the center insulating material.

10. The method as claimed in claim 1, wherein in Step (d), a polymer is atomized and deposited in the central groove by spray coating so as to form the center insulating material.

11. The method as claimed in claim 1, further comprising a step of removing the first conductive metal and the center insulating material on the first surface of the substrate after Step (d).

12. The method as claimed in claim 11, wherein the first conductive metal and the center insulating material are removed by etching or grinding the first surface of the substrate.

13. The method as claimed in claim 1, wherein Step (e) comprises:
   (e1) forming a second photo resist layer on the first surface of the substrate;
   (e2) forming a second opening on the second photo resist layer so that the position of the second opening corresponds to the groove, and the diameter of the second opening is larger than that of the groove; and
   (e3) forming the annular groove on the substrate according to the second opening.

14. The method as claimed in claim 13, further comprising a step of removing the second photo resist layer after Step (e3).

15. The method as claimed in claim 1, wherein in Step (e), the annular groove does not penetrate the substrate.

16. The method as claimed in claim 1, wherein in Step (e), the annular groove is formed by etching.

17. The method as claimed in claim 1, wherein Step (f) comprises:
   (f1) dispersing a polymer at a position corresponding to the annular groove; and
   (f2) impelling the polymer into the annular groove by vacuuming so as to form the first insulating material.

18. The method as claimed in claim 1, wherein Step (f) comprises:
   (f1) forming a plurality of second vents so as to connect the annular groove to the second surface of the substrate;
   (f2) dispersing a polymer at a position corresponding to the annular groove; and
   (d3) filling the annular groove and the second vents with the polymer so as to form the first insulating material.

19. The method as claimed in claim 1, wherein in Step (f), a polymer is atomized and deposited in the annular groove by spray coating so as to form the first insulating material.

20. The method as claimed in claim 1, wherein in Step (g), the part of the second surface of the substrate is removed by etching or grinding.

* * * * *